(12) United States Patent
Fallica et al.

(10) Patent No.: US 7,898,008 B2
(45) Date of Patent: Mar. 1, 2011

(54) VERTICAL-TYPE, INTEGRATED BIPOLAR DEVICE AND MANUFACTURING PROCESS THEREOF

(75) Inventors: Piero Giorgio Fallica, Catania (IT); Roberto Modica, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 869 days.

(21) Appl. No.: 11/779,681

(22) Filed: Jul. 18, 2007

(65) Prior Publication Data
US 2008/0017895 A1 Jan. 24, 2008

(30) Foreign Application Priority Data
Jul. 18, 2006 (IT) .......................... TO2006A0525

(51) Int. Cl.
*H01L 21/70* (2006.01)
(52) U.S. Cl. ..................... 257/273; 257/511; 438/149; 438/311
(58) Field of Classification Search .............. 257/273, 257/511, E21.7, E27.112; 438/149, 311
See application file for complete search history.

(56) References Cited

U.S. PATENT DOCUMENTS

| 5,602,417 | A | 2/1997 | Villa |
| 5,828,124 | A | 10/1998 | Villa |
| 2003/0155631 | A1* | 8/2003 | Nelle et al. .................. 257/565 |
| 2008/0017895 | A1* | 1/2008 | Fallica et al. ................. 257/273 |

* cited by examiner

*Primary Examiner*—Michael B Shingleton
(74) *Attorney, Agent, or Firm*—Lisa K. Jorgenson; Joshua A. Kading; Seed IP Law Group PLLC

(57) ABSTRACT

A bipolar device is integrated in an active layer, wherein delimitation trenches surround respective active areas housing bipolar transistors of complementary types. Each active area accommodates a buried layer; a well region extending on top of the buried layer; a top sinker region extending between the surface of the device and the well region; a buried collector region extending on top of the well region and laterally with respect to the top sinker region; a base region, extending on top of the buried collector region laterally with respect to the top sinker region; and an emitter region extending inside the base region. The homologous regions of the complementary transistors have a similar doping level, being obtained by ion-implantation of epitaxial layers wherein the concentration of dopant added during the growth is very low, possibly zero.

29 Claims, 9 Drawing Sheets

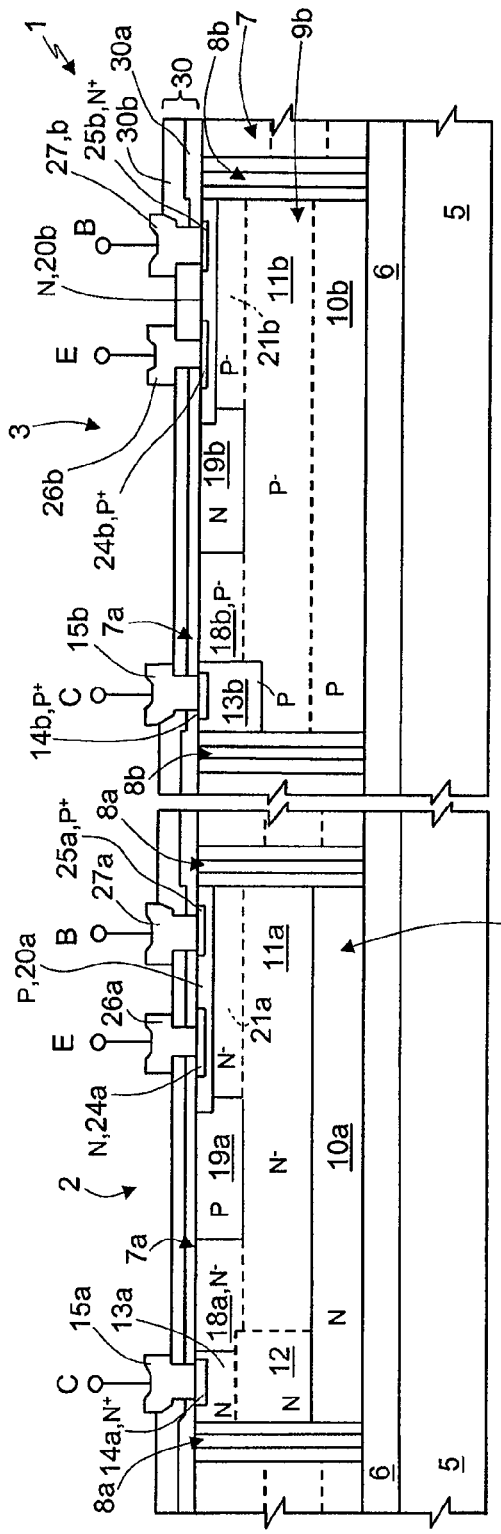
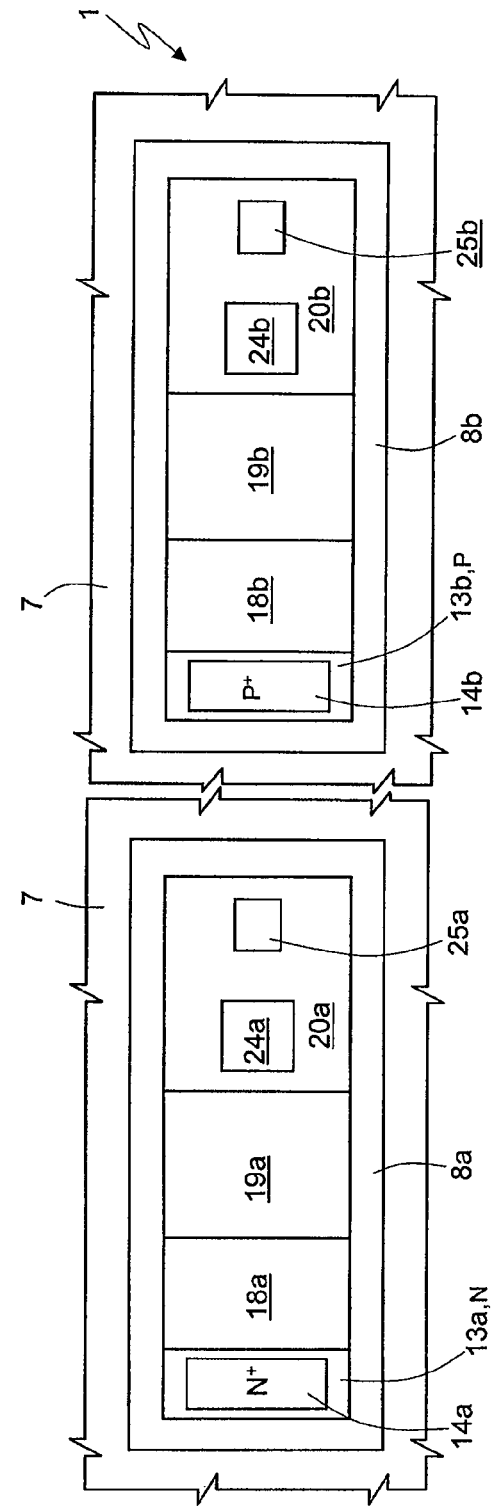
FIG. 6
FIG. 7

US 7,898,008 B2

VERTICAL-TYPE, INTEGRATED BIPOLAR DEVICE AND MANUFACTURING PROCESS THEREOF

BACKGROUND

1. Technical Field

The present invention relates to a vertical-type, integrated bipolar device and to the manufacturing process thereof.

2. Description of the Related Art

As is known, manufacture of some integrated circuits involves the use of technologies that are able to provide complementary bipolar transistors, namely NPN and PNP transistor, having very similar performances. These are readily obtainable with current technologies for the production of transistors not having a high performance as regards cut-off frequency, current-carrying capacity, and saturation voltage.

The most common and simplest way of making a PNP transistor resides in using the same layers that serve for making NPN transistors. This leads to the creation of vertical NPN transistors (as illustrated in FIG. 1) and of lateral PNP transistors (as illustrated in FIG. 2).

This solution leads, however, to NPN and PNP transistors having different characteristics.

If NPN and PNP transistors are to have comparable characteristics, it is necessary to make also the PNP transistor of a vertical type, which requires the addition of some layers (as may be seen in FIG. 3) and entails a certain complication in the design.

The manufacture of complementary bipolar transistors is also possible using SOI (Silicon-On-Insulator) substrates. As is known, SOI substrates are formed by a bottom conductive layer, in general silicon, an insulating layer, typically silicon oxide, and a top layer, of monocrystalline silicon, which houses the active structures. Examples of PNP and NPN transistors formed in a SOI substrate are illustrated in FIG. 4 and FIG. 5, respectively. As may be noted, these solutions use a trench insulation that reaches the insulating $SiO_2$ layer. Layers dedicated for insulating the collector from the substrate and from the other components are not necessary, and the two structures are complementary.

Also these known solutions, however, are not suitable in the case where high cut-off frequencies and high operating voltages (higher than 30-40 V) are required, in so far as the transistors that can be obtained are able to withstand a BVceo voltage (collector-to-emitter breakdown voltage with open base) of just a few volts.

In general, it is difficult to obtain complementary bipolar structures having not excessive dimensions and high-frequency characteristics. In fact:

- to obtain high cut-off frequencies, the emitter and the base of the transistors should be made sufficiently thin; if the base is very thin, an adequate edge structure may be needed for withstanding the voltage; a voltage higher than 40-50 V requires a BVcbo (collector-to-base breakdown voltage with open emitter) higher than 120-150 V;
- an edge structure for voltages higher than 100 V (implanted ring or field plate) involves a certain bulk; and
- in the complementary transistors, it may be necessary to provide well regions and buried regions for implanting dopant ions of opposite sign with respect to the original epitaxy; consequently, the collector of the transistor having the implanted regions has higher concentrations than the complementary transistor and thus different breakdown voltages.

BRIEF SUMMARY

One embodiment of the present invention discloses a manufacturing process that provides complementary bipolar transistors and thus transistors having high and comparable electrical characteristics that overcome the drawbacks of the prior art.

According to one embodiment of the present invention, there are provided a-vertical type, integrated bipolar device and the corresponding process for manufacture thereof, as defined in claim 1 and 15, respectively.

BRIEF DESCRIPTION OF THE SEVERAL VIEWS OF THE DRAWINGS

For a better understanding of the invention, an embodiment thereof is now described, purely by way of non-limiting example and with reference to the attached drawings, wherein:

FIG. 6 shows a cross-section of a wafer of semiconductor material incorporating bipolar transistors of complementary types according to one embodiment of the invention;

FIG. 7 shows a top plan view of the wafer of FIG. 6;

DETAILED DESCRIPTION

Figure 1:
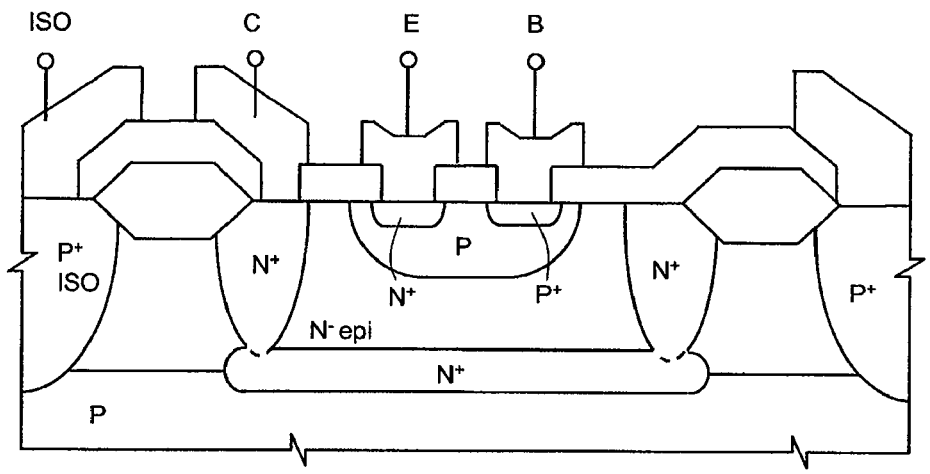
FIGS. 1-5 are cross-sections of bipolar transistors of a known type.
Figure 2:
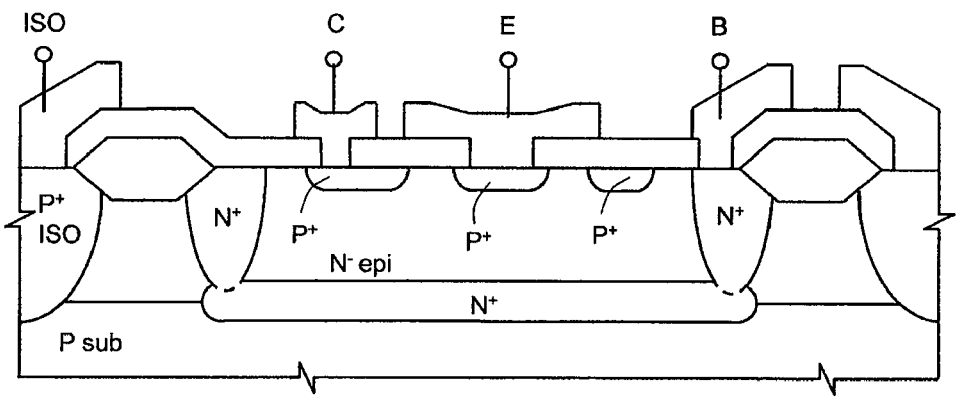
Figure 3:
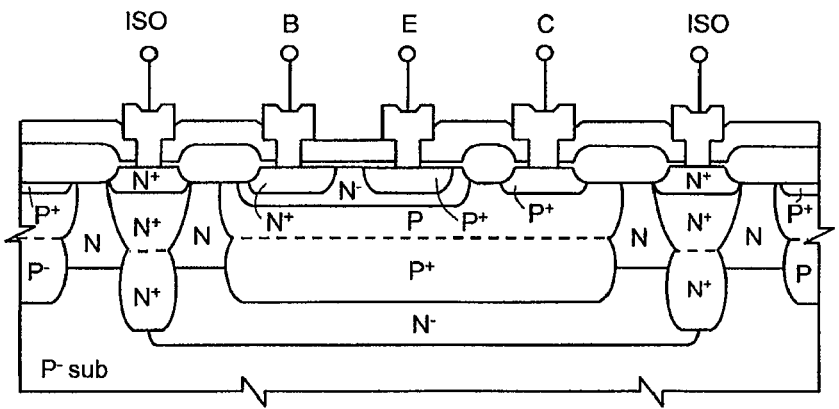
Figure 4:
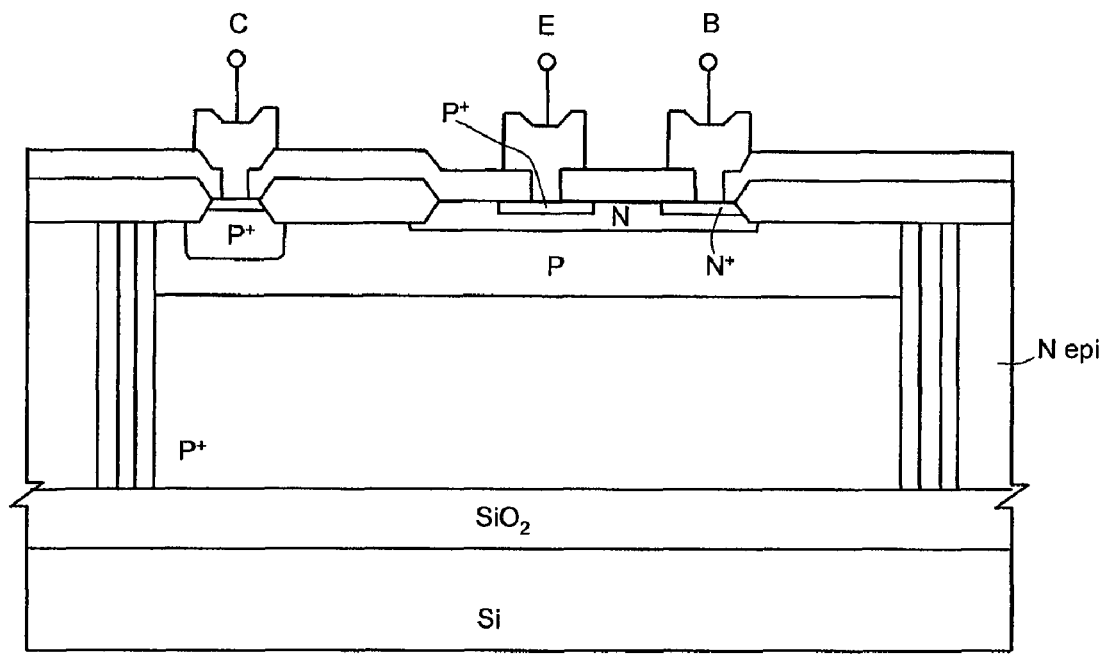
Figure 5:
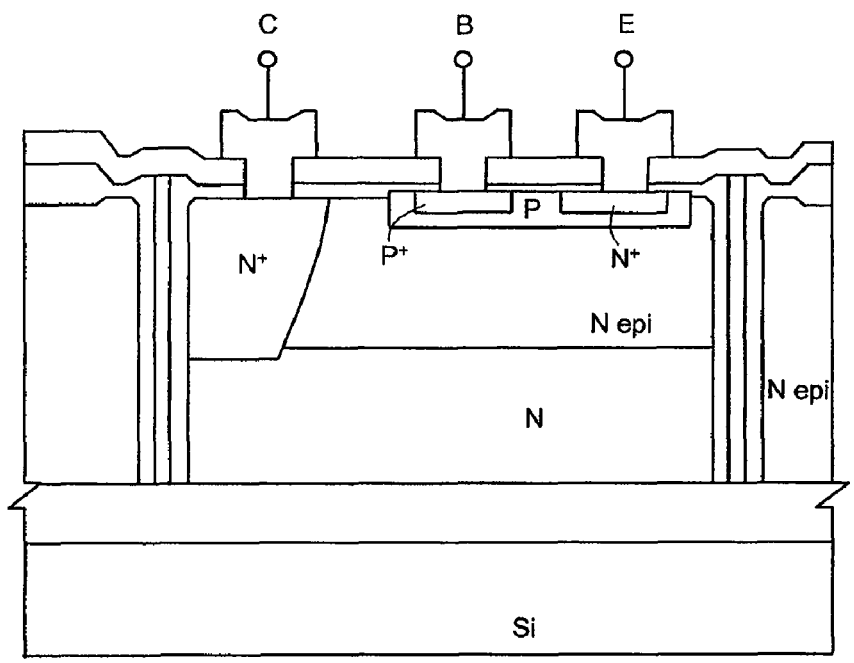
Figure 8:
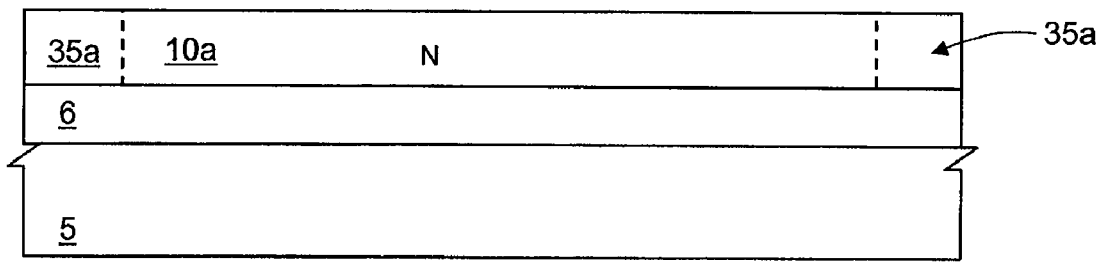
FIGS. 8-13 are cross-sections through the wafer of FIGS. 6-7, in successive fabrication steps of the complementary bipolar transistors.

FIG. 6 shows a cross-section of an integrated device 1 comprising a first embodiment of a pair of complementary bipolar transistors, namely, an NPN transistor 2 on the left and a PNP transistor 3 on the right. FIG. 7 shows a top plan view of the same integrated device 1. Since the structure of the two transistors is practically identical, they will be described together, using the same reference numbers for homologous regions, and distinguishing them only by the letters a or b, according to whether they refer to the NPN transistor 2 or to the PNP transistor 3, respectively.

The embodiment shown regards a solution that uses an SOI (Silicon-On-insulator) substrate and comprises a handle layer 5, of silicon, an insulating layer 6, for example, of silicon oxide, and an active layer 7, of monocrystalline silicon. The active layer 7 has a surface 7*a*. Trenches 8*a*, 8*b* insulate respective active areas 9*a* and 9*b*, accommodating the NPN transistor 2 and the PNP transistor 3, respectively, and housing similar regions, but with opposite polarities, for the two transistors.

In detail, a buried layer 10*a*, 10*b*, of N type and P type, respectively, extends on top of the insulating layer 6, forms a buried collector region and is overlaid by a well region 11*a*, 11*b*, of N-type and P-type, respectively. A bottom sinker region 12 of N type extends throughout the depth of the well region 11a and electrically connects the buried layer 10a with a top sinker region 13a, of N+ type, facing the surface 7a of the active layer 7. A top sinker region 13b, of P+ type, extends likewise between the well region 11b and the surface 7a. The bottom sinker region 12 and top sinker region 13a, 13b extend adjacent to one side of the respective delimitation trench 8a and 8b, respectively. Enriched contact regions 14a, 14b, of N+ type and P+ type, respectively, extend inside the top sinker regions 13a, 13b and are in electrical contact with metal collector contacts 15a, 15b. The bottom sinker region 12 and the top sinker region 13a form a low-resistivity path between the metal collector contact 15a and the buried layer 10a. For the PNP transistor 3, it is not necessary to make a bottom sinker region, because of the greater diffusiveness of boron; the low-resistivity path between the metal collector contact 15b and the buried layer 10b is thus guaranteed by the top sinker region 13b, which extends at a greater depth than the homologous region 13a (as may be seen from the comparison of the doping profiles of FIGS. 14 and 15, described in greater detail hereinafter).

A sequence of regions face the surface 7a of the active layer and extend between each top sinker region 13a and 13b, respectively, and the non-adjacent side of the respective delimitation trench 8a, 8b. The sequence includes a first collector region 18a, 18b of N type and P type, respectively, a termination region 19a, 19b, of P type and N type, respectively, and a base region 20a, 20b. In detail, the first collector regions 18a, 18b (referred to also as surface collector regions) and the termination regions 19a, 19b extend as far as the respective well region 11a, 11b, respectively, while the base regions 20a, 20b have a smaller depth than the regions 18 and 19. Consequently, a second collector region 21a, 21b, of N type and P type, respectively, referred to also as buried collector region, extends between the respective base region 20a, 20b and the respective well region 11a and 11b, respectively. The first and second collector regions 18a, 21a, 18b, 21b, preferably have not only the same conductivity type, but also the same doping level, since they are preferably obtained through a same implantation, as explained in greater detail hereinafter.

An emitter region 24a, 24b, of N type and P type, respectively, and a base-contact region 25a, 25b, of P+ type and N+ type, respectively, extend inside the respective base region 20a, 20b. The emitter regions 24a, 24b are in electrical contact with a respective metal emitter contact 26a, 26b; the base-contact regions 25a, 25b are in electrical contact with a respective metal base contact 27a, 27b.

An insulation layer 30 covers the surface 7a of the active layer and is interrupted only at the metal contacts 15a, 15b, 26a, 26b, 27a, 27b; in the example shown, the insulation layer 30 is formed by a field-oxide layer 30a and by a top oxide layer 30b. The structure is moreover coated by a passivation layer (not shown).

Figure 14:
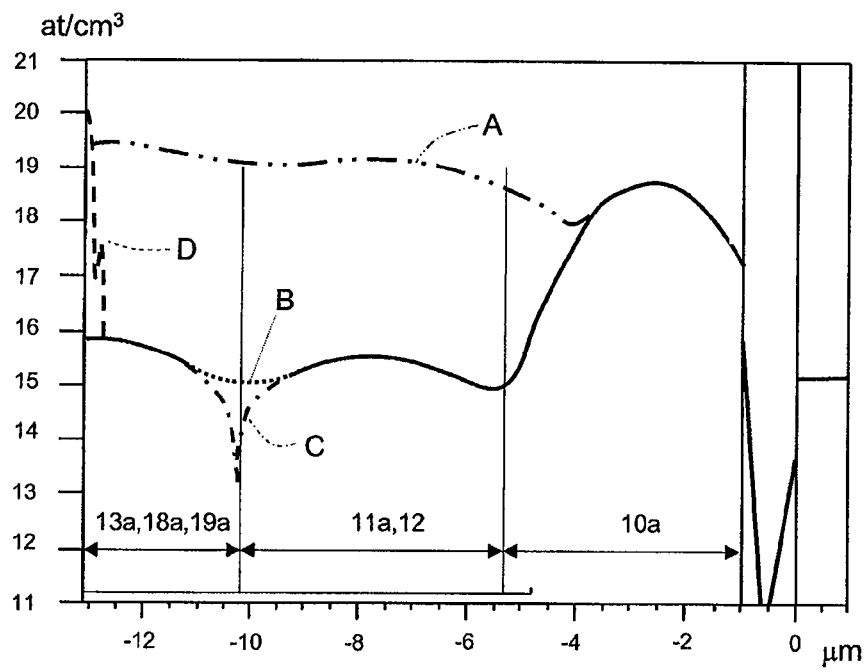
FIGS. 14, 14*a* and 15 show the doping profiles of the device of FIGS. 6 and 7.
Figure 15:
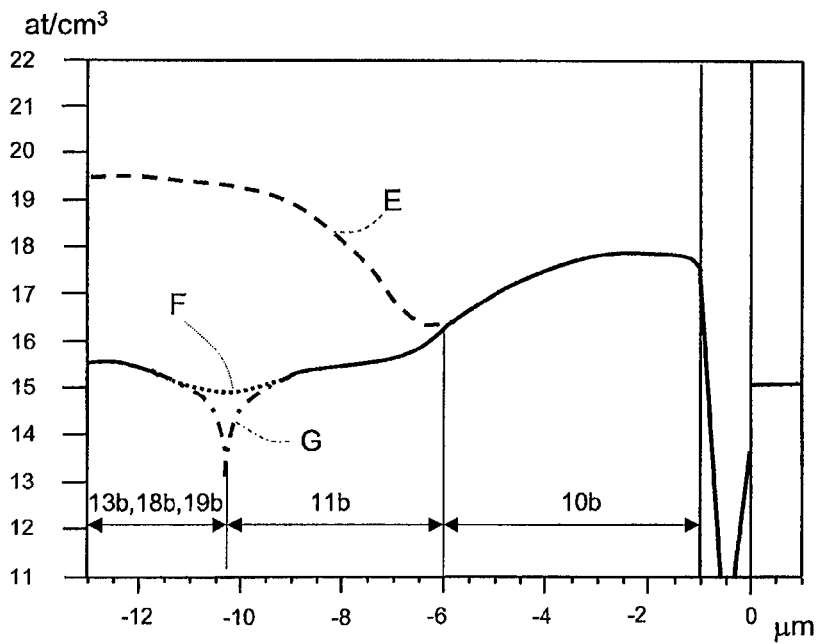

FIGS. 14 and 15 show the dopant profiles in the NPN transistor 2 and in the PNP transistor 3 respectively, of FIG. 6. In both figures, the portion comprised between +2 μm and 0 μm refers to the handle layer 5, the portion comprised between 0 μm and −1 μm refers to the insulating layer 6, and the curves A-D and E-G, respectively, refer to the active layer 7.

Figure 14A:
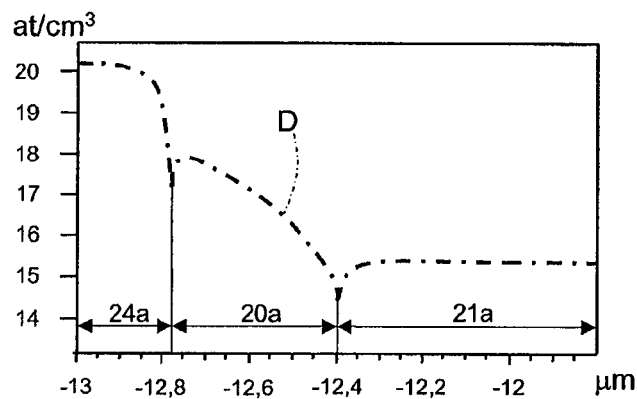

In detail, in FIG. 14, the curve A shows the profile of dopants (all of N type) through the buried layer 10a, the bottom sinker region 12, and the top sinker region 13a. The dopant concentration in this portion is rather high, but approximately constant, thanks to the use of different epitaxial growths, as explained hereinafter. The curve B shows the profile of dopants (all of N type) through the buried layer 10a (from −1 μm to approximately −5 μm), the well region 11a (from −5 μm to −10 μm), and the first collector region 18a (from −10 μm to −13 μm). In the case of the curve B, with the exception of the portion corresponding to the buried layer 10a, the dopant concentration is lower and is slightly variable as a function of the depth. The curve C shows the profile of dopants through the buried layer 10a (of N type, from −1 μm to −5 μm), the well region 11a (of N type, from −5 μm to −10 μm), and the termination region 19a (of P type, from −10 μm to −13 μm). The curve D (see in particular the enlarged detail of FIG. 14a, corresponding to the regions 24a, 20a and part of the 21a) shows the profile of dopants through the buried layer 10a (of N type, from −1 μm to −5 μm), the well region 11a (of N type, from −5 μm to −10 μm), the second collector region 21a (of N type, from −10 μm to −12.4 μm), the base region 20a (of P type, from −12.4 μm to −12.8 μm) and the emitter region 24a (of N type, from −12.8 μm to −13 μm).

In FIG. 15, the curve E shows the profile of dopants (all of P type) through the buried layer 10b (approximately from −1 μm to −6 μm), the well region 11b (approximately from −6 μm to −10 μm) and the top sinker region 13b (approximately from −20 μm to −13 μm). The curve F shows the profile of dopants (all of P type) through the buried layer 10b (approximately from −1 to −6 μm), the well region 11b (from −6 to −10 μm), and the first collector region 18b (from −10 to −13 μm). The curve G shows the profile of dopants through the buried layer 10b (of P type, from −1 μm to −6 μm), the well region 11b (of N type, from −6 μm to −10 μm), and the termination region 19b (of N type, from −10 μm to −13 μm).

As may be noted, the profiles of dopants in the NPN transistor 2 and in the PNP transistor 3 are similar in homologous regions (they generally differ by less than one order of magnitude, in any case less than two orders of magnitude), except as regards the connection between the buried layer 10a, 10b and the top sinker region 13a, 13b, mainly for reasons of different diffusiveness of the dopants N and P and the presence of just the bottom sinker region 12.

In the integrated device of FIGS. 6 and 7, the first and second collector regions 18a, 18b, 21a, 21b and the termination regions 19a, 19b have a dual function. First of all, these regions, together with the well regions 11a, 11b, provide the collector concentration that withstands the voltage employed. Since these regions are obtained by ion implantation starting from epitaxial layers 35b-35c with negligible concentration (as will be better explained hereinafter with reference to FIGS. 8-13), the collector regions 18, 21 for the NPN transistor 2 and PNP transistor 3 can have the same resistivity; thus the two transistors have approximately the same breakdown voltage. In this way, neither of the two, NPN and PNP, transistors is penalized, as instead would occur if an epitaxy were used doped during growth, at the level used for one or the other transistor, NPN or PNP. In this case, in fact, the other collector may need to be more heavily doped. Consequently, a greater epitaxial thickness may be needed, and the resulting transistor would have a higher saturation collector resistance ($R_{Csat}$).

In addition, the first and second collector regions 18a, 18b, 21a, 21b and the termination regions 19a, 19b act as edge termination for the base-collector junctions. In fact, the base regions 20a, 20b are very thin (to obtain a high cut-off frequency). Therefore, in the absence of an adequate edge termination, a very low breakdown voltage would be obtained. Since the termination regions 19a, 19b are deeper than the respective base regions 20a, 20b, a particularly effective solution is obtained, without penalizing the cut-off frequency.

This improved behavior is confirmed by the simulations conducted by the applicant, which have shown that the present structure, provided with the termination region 19a, 19b, has a breakdown voltage that is twice that of the known structures.

In the device shown, as regards the collector (first and second collector regions 18, 21, well region 11 and buried layer 10), it is possible to contain much better the process dispersions with respect to a collector doped during the epitaxial growth, thanks to the use of ion implantation.

The integrated device 1 of FIGS. 6 and 7 can be manufactured using the process described hereinafter with reference to FIGS. 8-13, which show in detail only the portion corresponding to the NPN transistor.

The process initially uses an SOI substrate comprising the handle layer 5, the insulating layer 6, and a bottom layer 35a of monocrystalline silicon, which, together with successive epitaxial layers (as described in detail hereinafter), forms the bottom part of the active layer 7. The SOI substrate is formed according to any of the known techniques, and the thickness of the bottom layer 35a varies from a few hundreds of nanometers as far as a few tens of micrometers, according to the needs and the operating voltages required for the integrated device 1.

The buried layer 10a, of N type, is formed inside the bottom layer 35a, using known photolithographic and ion-implantation techniques (FIG. 8); the buried layer 10b, of P type, is formed immediately before or immediately thereafter. The two buried layers 10a, 10b are then diffused, either together or separately.

A first epitaxial layer 35b is grown on the bottom layer 35a. The thickness of the first epitaxial layer 35b is chosen so as to be approximately half the thickness necessary to withstand the voltages required of the integrated device 1. The concentration of dopant added to the silicon during growth is very low, possibly zero. Preferably, the first epitaxial layer 35b, after growth, has a doping level lower by at least one decade with respect to the doping level added subsequently via ion implantation and diffusion. In the examples shown, the mean doping level is approximately $5 \times 10^{15}$. Thus the dopant level introduced during the epitaxial growth is lower than approximately $5 \times 10^{14}$. Thereby, it is possible to obtain a good control over the process. The conductivity type of the possible dopant may be, indifferently, either N or P.

Then (FIG. 9), an N-well phototechnique is carried out, followed by an N-type implantation, preferably of phosphorus, on top of the buried layer 10a. Subsequently or previously, a P-well phototechnique is carried out, followed by a P-type implantation, preferably of boron, on top of the buried layer 10b. After the diffusion of the dopants, the N-well region 11a (FIG. 9) and the corresponding P-well region 11b (FIG. 6) are obtained.

Figure 9:
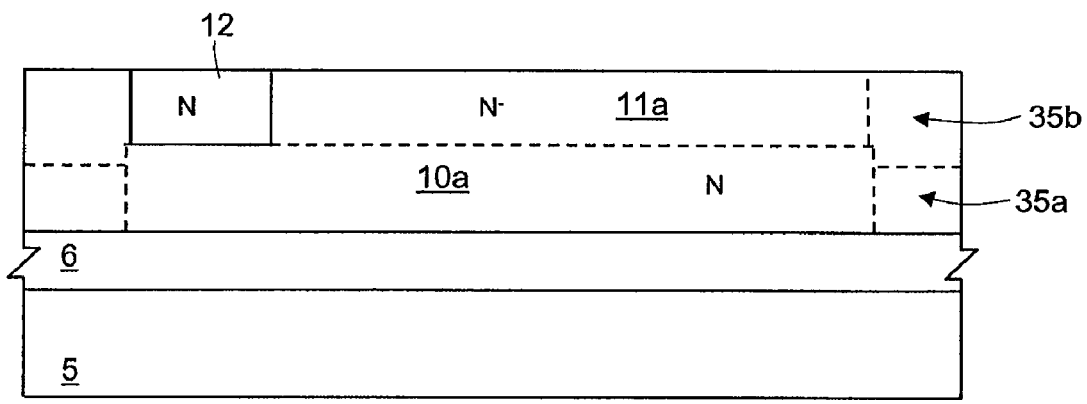

Next, or before forming the well regions 11, an N-type dopant is implanted at a high dose to obtain the bottom sinker region 12 (FIG. 9). As indicated, a similar implantation is not necessary for the PNP transistor.

A second epitaxial layer 35c (FIG. 10) is then grown, having a thickness approximately equal to that of the first epitaxial layer and thus able to withstand approximately half of the voltage required. Also in this case, the concentration of dopant added during growth is very low, possibly zero. Preferably, the second epitaxial layer 35c, after the growth, has a doping level lower by at least one decade than the level added subsequently via ion implantation and diffusion. The set of the layers 35a, 35b and 35c thus forms the active layer 7 of FIG. 1.

Figure 10:
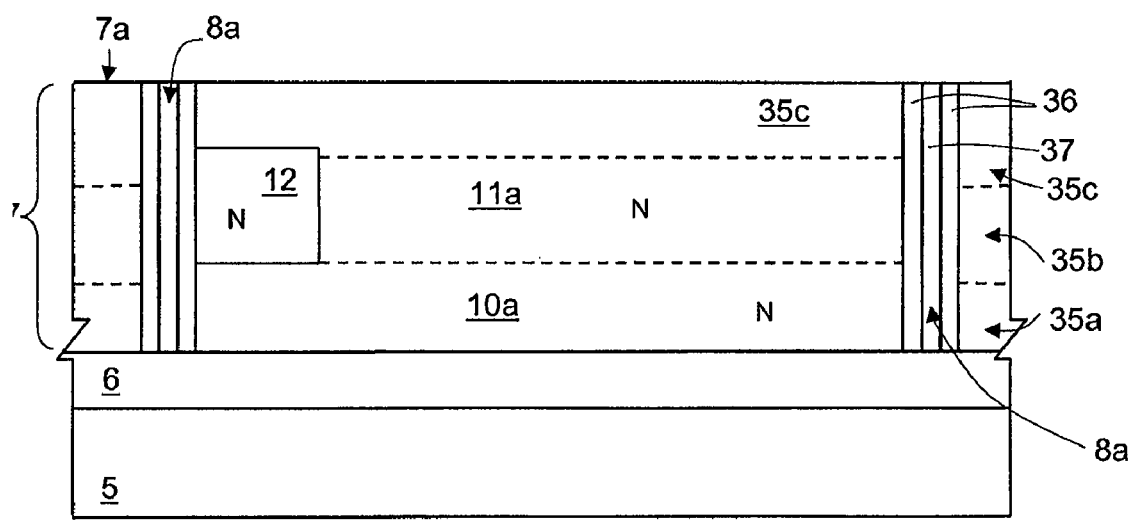
Figure 11:
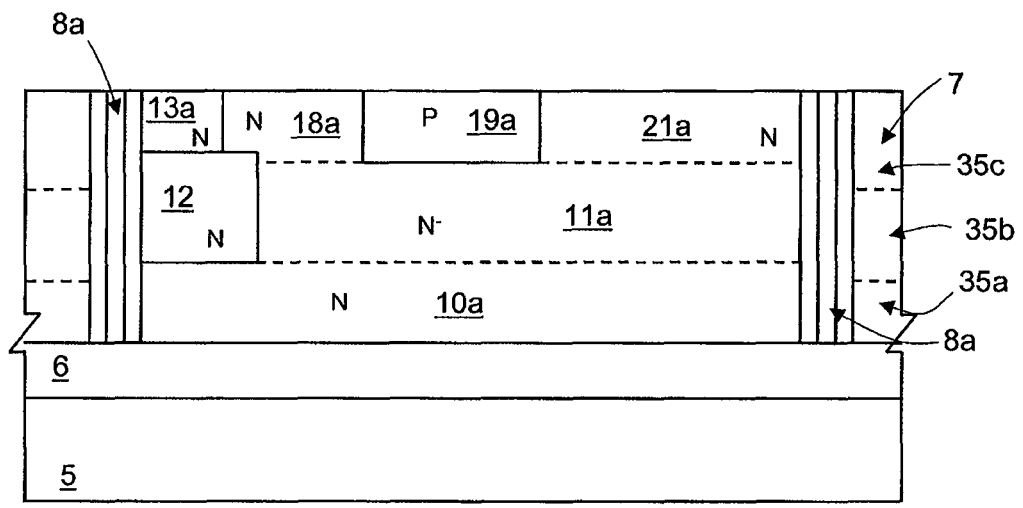
Figure 12:
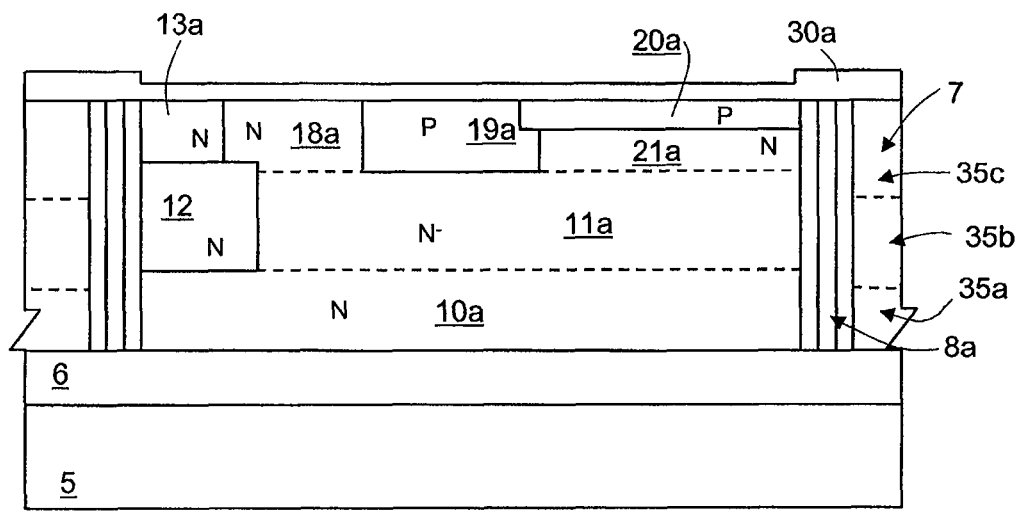
Figure 13:
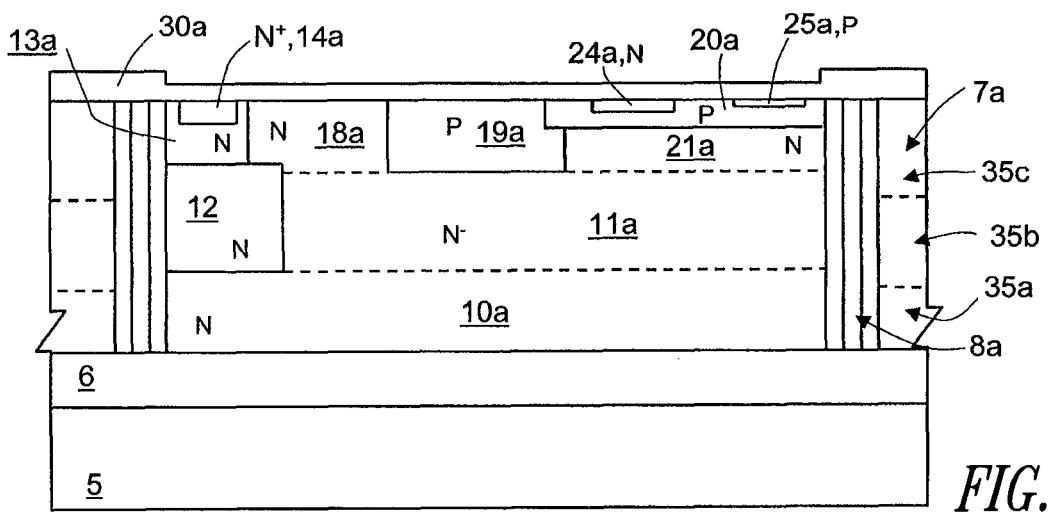

Next, the trenches 8a, 8b are formed according to known techniques. For example, the surface 7a of the active layer 7 is coated with oxide, so as to form a hard mask, the active layer 7 is dug as far as the insulating layer 6 and the trench is filled with an oxide layer 36 and a polysilicon layer 37 (FIG. 10). Alternatively, the trench can be filled with a single oxide layer, or else with a triple layer of oxide, silicon nitride, and polycrystalline silicon.

Next (FIG. 11), four regions are implanted and diffused: the top sinker region 13a, 13b; the first collector region 18a, 18b; the second collector region 21a, 21b; and the termination region 19a, 19b. The order of formation of the four regions is not important. It is, however, advantageous for the first and second collector regions 18a, 18b, 21a, 21b to be formed in areas different from that of the termination region 19a, 19b (except for a small overlapping along the respective perimeters in order to take into account the inevitable misalignment of phototechniques).

Next (FIG. 12), the field-oxide layer 30a is formed, which is thermally grown on the surface 7a of the active layer 7 and forms, as has been said, a first protection layer. Using a purposely provided mask (not shown), the base region 20a, of P type, is implanted and diffused in the second collector region 21a; likewise, the base region 25b, of N type, is provided in the second collector region 21b.

Next (FIG. 13), the emitter regions 24a, 24b and the base-contact regions 25a, 25b are formed inside the base regions 25a, 25b. In particular, in one step, dopant ions of N type (for example arsenic) are implanted and then diffused inside the base regions 25a, 25b to form the emitter region 24a and the base-contact region 25b; dopant ions of P type (for example, boron) are implanted and then diffused in a different step (either previous or following) to form the emitter region 24b and the base-contact region 25a.

Finally, the top oxide layer 30b is deposited by CVD, the contacts are opened, one or more metal layers are deposited, and the metal layer or layers are shaped to provide the contacts 15, 26 and 27, thereby obtaining the structure of FIG. 6.

The process described with reference to FIGS. 8-15 moreover enables complementary MOS transistors to be formed having threshold voltages with very similar values, without having to resort to threshold-adjustment implantations. In fact, with the process described, the dopant concentrations of the surface layers, first and second collector regions 18, 21, and termination region 19, have levels that in absolute value are similar and substantially the same (as is evident from the curves C and F in FIGS. 14 and 15).

Figure 16:
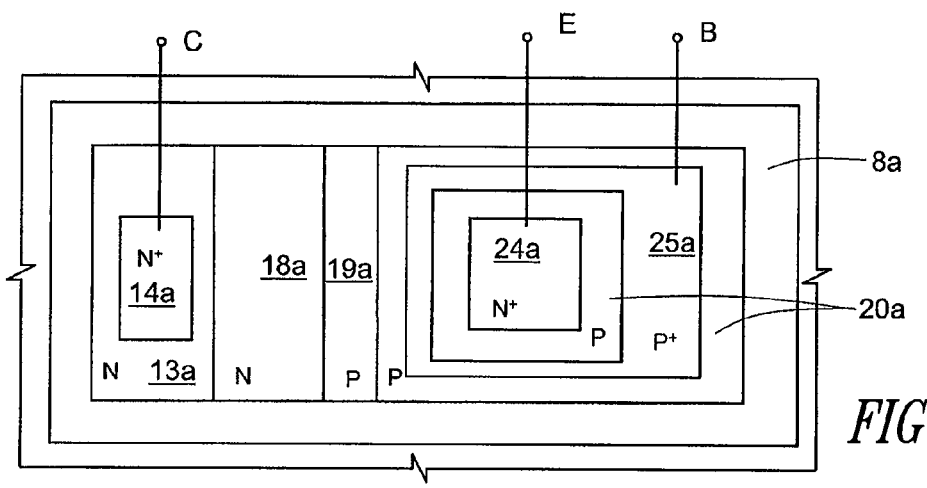
FIGS. 16 and 17 show top plan views of two possible variants of the layout of FIG. 7.
Figure 17:
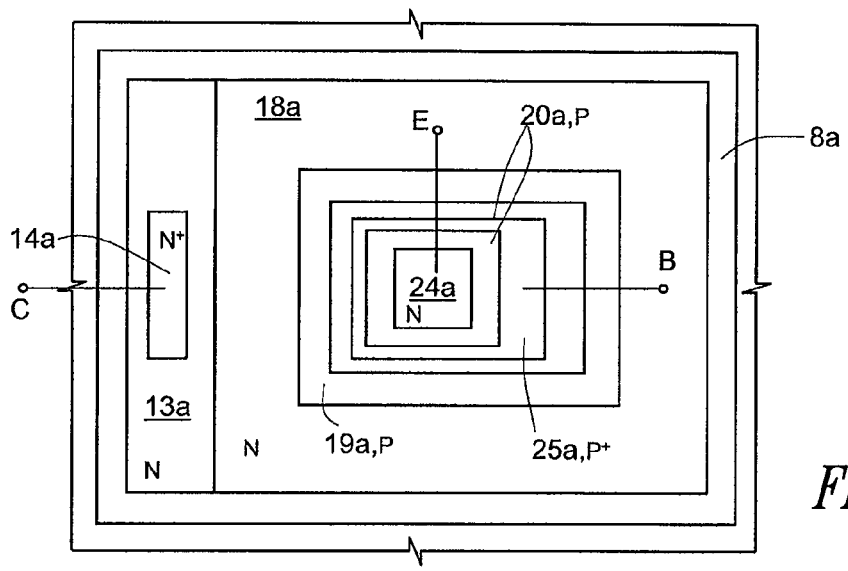

FIGS. 16 and 17 show different layouts. Both figures refer to an NPN transistor. It is evident, however, that if the conductivity types of the different regions are reversed, corresponding PNP transistors are obtained.

In detail, FIG. 16 regards a structure wherein the base-contact region 25a extends ring-like around the emitter region 24a. For the rest, the structure is identical to the one represented in FIGS. 6 and 7. In this way, the gain of the lateral component of the transistor is reduced, and the transistor depends more closely upon the gain of the vertical transistor.

In FIG. 17, also the first collector region 18a and the termination region 19a extend ring-like around the base region 20a. In this way, the breakdown-voltage strength improves, at the expense of the area of the device, in this case considerably greater as compared to the layout of FIGS. 6 and 7.

It is evident that numerous intermediate variants can be provided, including the provision of just the ring-shaped termination region 19a, with a ring-shaped base-contact region 25a or as is illustrated in FIG. 7; or else provision of a ring-shaped first collector region 18a and a ring-shaped termination region 19a, but with the base-contact region 25a shaped as illustrated in FIG. 7.

Figure 18:
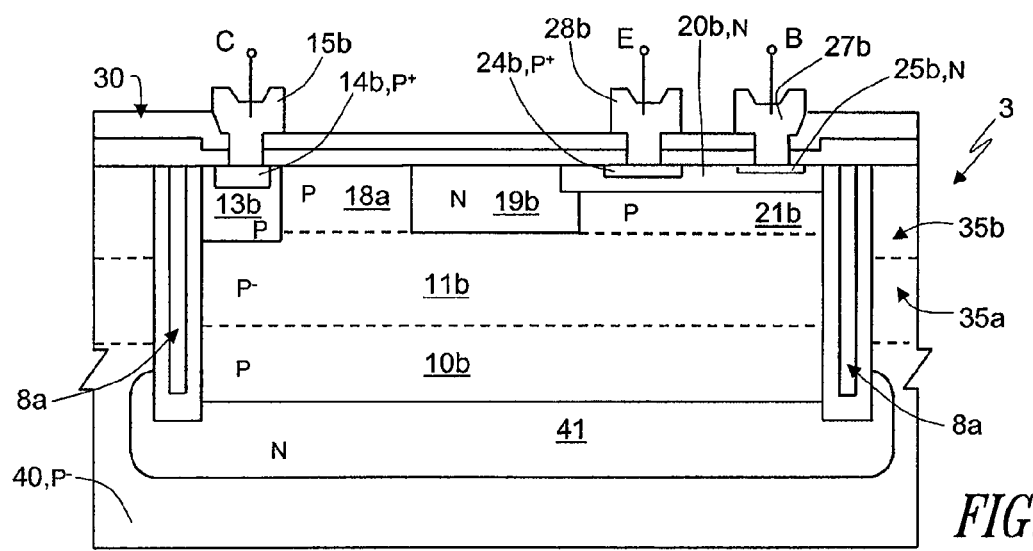
FIGS. 18-20, 22 are cross-sections through a wafer of semiconductor material according to different embodiments of the invention.

FIG. 18 shows a different embodiment based upon a starting substrate which is not SOI and is of a P-type. In particular, FIG. 18 regards a PNP transistor, wherein an insulation layer 41, of N type, insulates the collector (well region 11b and buried layer 10b) from the substrate 40. The insulation layer 41 can be implanted and diffused before the buried layer 10b, directly in the substrate 40. In practice, the substrate 40 replaces the handle layer 5, and the insulation layer 41 replaces the insulating layer 6 of FIG. 6. For the rest, the structure of FIG. 18 is identical to the structure on the right in FIG. 6.

In case of an NPN transistor with a starting substrate which is not SOI and is of P-type, it is not, instead, necessary to provide an insulation layer similar to the layer 41, since the collector and the substrate have opposite conductivity types.

Figure 19:
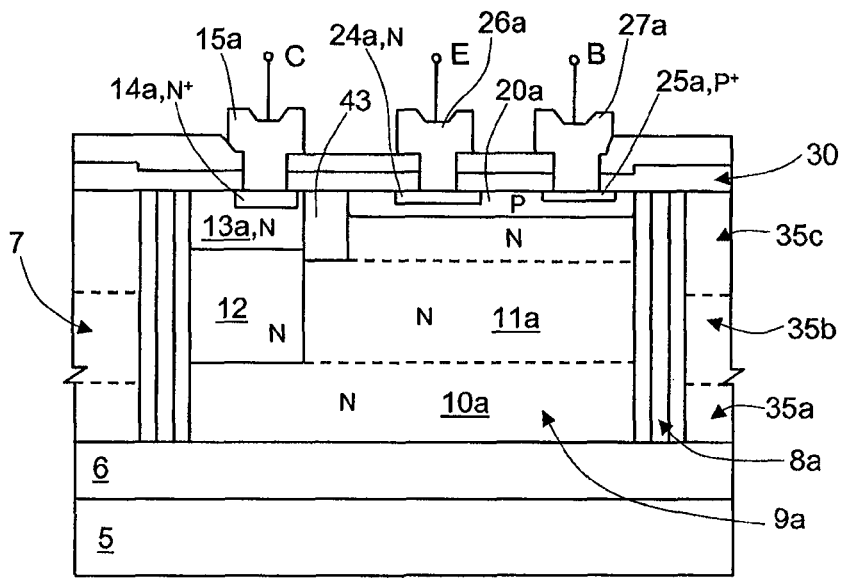

FIG. 19 shows an embodiment wherein the edge termination of the transistor (here NPN) is formed by a shallow-trench region 43. In addition, the first collector region 18 is no longer present. In the example shown, the shallow-trench region 43 is contiguous on one side to the sinker regions 12, 13a and on the other side to the base region 20a and to the buried collector region 21a. The shallow-trench region 43 has a smaller depth than the delimitation-trench region 8a; in the example illustrated, it extends approximately into the second epitaxial layer 35c. This solution enables a further reduction in the final dimensions and in the base-collector parasitic capacitance of the device, at the expense of additional process steps for providing the shallow-trench region 43. In particular, this region is obtained using another photolithography, another silicon etching, and another filling of the shallow trench, rendering this variant useful where the requirements regarding costs are less stringent with respect to the ones regarding the dimensions.

Figure 20:
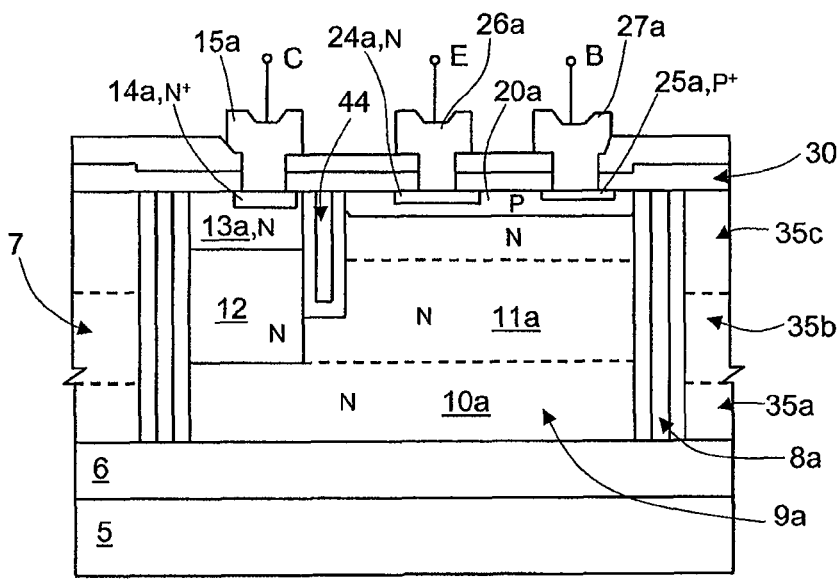
Figure 21:
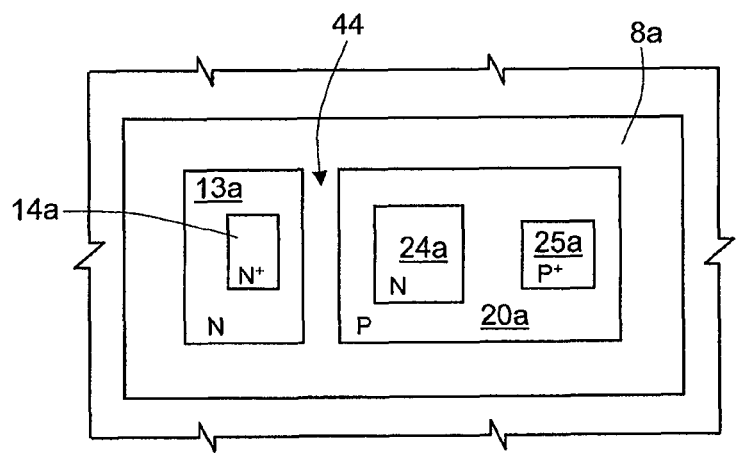
FIG. 21 shows a top plan view of the structure of FIG. 20.

Alternatively, using a property of the machines for dry silicon etch (e.g., the model CENTURA DPS of the company AMAT), whereby the depth of the trenches depends upon the width of the openings of the masks, it is possible to form both the trenches 8a, 8b and shallower trenches 44 using just one process of digging the trenches, as shown in FIG. 20 in cross-section and in FIG. 21 in top plan view. In particular, in these machines, for a same etching time, the thinner trenches are shallower. In this case, it is possible to set the process so that the digging operations for forming the trenches 8a, 8b will have a depth such as to reach the deep oxide or the insulation layer 41, whilst the digging operations for forming the region with variable depth 44 terminate before the buried layer 10a, 10b. In this case, a simpler process flow, minimum dimensions of the transistor, and low manufacturing costs are obtained.

Figure 22:
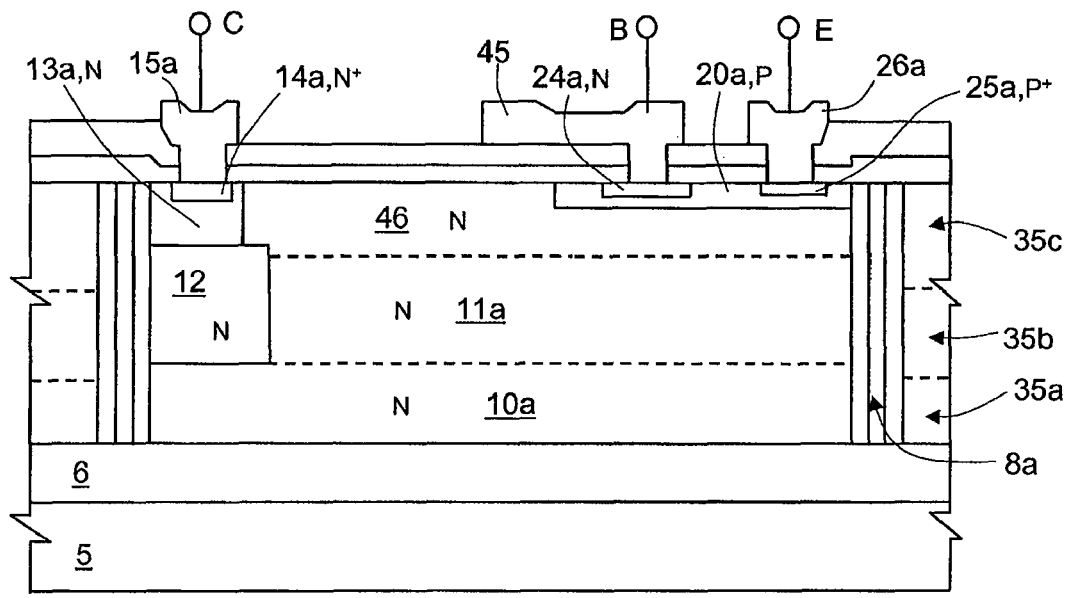

FIG. 22 shows an embodiment wherein the edge termination of the transistor (here an NPN) is formed by a field-plate region 45, extending on top of the insulation layer 30 and formed as extension of the metal base contact 27a. The field-plate region 45 can be of metal or polycrystalline silicon. In this case, the position of the emitter region 24a is changed round with respect to that of the base-contact region 25a, the first and second collector regions 18a, 21a are joined to form a single collector region 46, and the field-plate region 45 extends beyond the base-collector PN junction.

Figure 23:
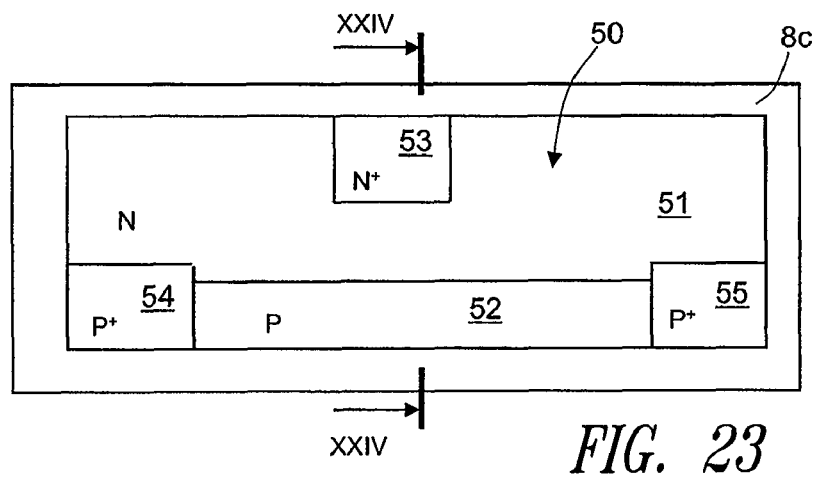
FIG. 23 shows a top plan view of a device implementing a JFET.
Figure 24:
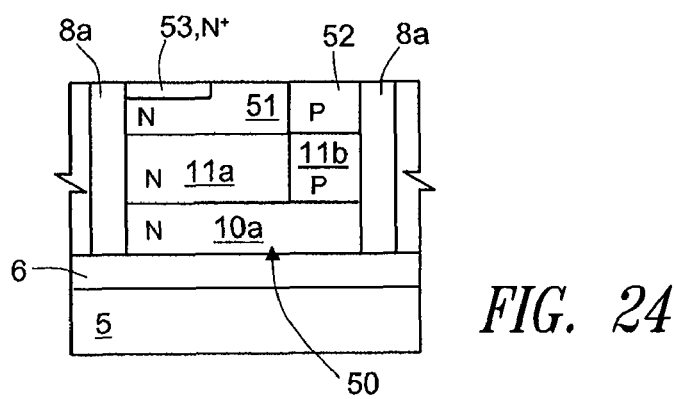
FIG. 24 shows a cross-section taken along line XXIV-XXIV of FIG. 23.

With the process described, it is finally possible to obtain complementary JFETs in a same integrated device 1. FIGS. 23 and 24 show an exemplary layout, respectively, in top plan view and in cross-section, wherein an external trench 8c surrounds an active area 50 comprising a bulk region 51 of a first conductivity type (for example, N type), corresponding to the collector regions 18a, 18b, 21a, 21b, and a channel region 52 of a second conductivity type (here P type), corresponding to the termination region 19a, 19b. In this case, the bulk region 51 houses a gate-contact region 53, having the first conductivity type and higher doping level (here N+ type), while the channel region 52 houses a source contact 54 and a drain contact 55, having the second conductivity type and a higher doping level (here P+ type). The same type of layout can be obtained with conductivities of the opposite type. As may be seen from the cross-section of FIG. 24, the bulk region 51 extends on top of an N-well region, designated by 11a by analogy with FIG. 6, while the channel region 52 extends on top of a P-well region, designated by 11b. In turn, the well regions 11a, 11b extend on top of the buried layer 10a.

In this case, the shown structure provides P-channel and N-channel JFETs having thresholds very close to one another in the same chip accommodating complementary NPN and PNP transistors.

Finally, it is evident that modifications and variations may be made to the device and process described herein, without thereby departing from the scope of the present invention.

In particular, it is emphasized that the variants proposed (surface collector region 18 in a ring, termination region 19 in a ring, field plate 45, non-SOI substrate, termination formed by a shallow trench 43, trenches with variable depth 44) can be combined in various ways to obtain an extremely wide range of variants, only some of which are shown. The invention is thus not limited to the combinations shown but also covers all the possible combinations (for example, the use of trenches with variable depth or of a field plate with a non-SOI substrate).

In addition, the SOI substrate can be obtained with any known technology, for example by bonding two substrates of monocrystalline silicon through the insulating layer 6.

In addition, the formation of the trenches 8a can be postponed to subsequent steps; for example, the trenches can be obtained after forming the implanted regions.

In the examples shown, the areas external to the trenches 8a, 8b maintain the low doping level given by the epitaxial growth. However, it is possible to dope also the external part, for example, to provide a ground network. For this purpose, it is possible to dope the external portions in a similar way and at the same time as the buried layer 10a, the well region 11a, the collector regions 18a and 21a, and the sinker regions 12 and 13a, obtaining a N type doping. Alternatively, it is possible to provide a ground network of P type, using process steps similar and simultaneous to the ones that lead to formation of the buried layer 10b, the well region 11b, the collector regions 18b and 21b and the deep region 13b.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet, are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A vertical-type integrated bipolar device, comprising:
   an active layer, of semiconductor material, having a surface;
   a first delimitation trench, surrounding a first active area in said active layer;
   a second delimitation trench, surrounding a second active area in said active layer;
   a first buried layer of a first conductivity type inside said first active area;
   a second buried layer of a second conductivity type inside said second active area;
   a first well region of the first conductivity type inside said first active area and on top of the first buried layer;
   a second well region of the second conductivity type inside said second active area and on top of the second buried layer;
   a first top sinker region of the first conductivity type, extending inside said first active area and on top of said first well region, said first top sinker region facing said surface and being electrically coupled to said first buried layer;
   a second top sinker region of the second conductivity type, extending inside said second active area and on top of said second well region, said second top sinker region facing said surface and being electrically coupled to said second buried layer;
   a first buried collector region, of the first conductivity type, extending inside said first active area, on top of said first well region and laterally with respect to said first top sinker region;
   a second buried collector region, of the second conductivity type, extending inside said second active area, on top of said second well region and laterally with respect to said second top sinker region;
   a first base region, of the second conductivity type, extending inside said first active area, on top of said first buried collector region and laterally with respect to said first top sinker region, said first base region facing said surface;
   a second base region, of the first conductivity type, extending inside said second active area, on top of said second buried collector region and laterally with respect to said second top sinker region, said second base region facing said surface;
   a first emitter region, of the first conductivity type, extending inside said first base region and facing said surface;
   a second emitter region, of the second conductivity type, extending inside said second base region and facing said surface;
   a first termination region being between said surface and said first well region, being arranged between said first top sinker region and the first base region, and extending below at least a portion of the first base region; and
   a second termination region being between said surface and said second well region, being arranged between said second top sinker region and the second base region, and extending below at least a portion of the second base region.

2. The device according to claim 1, wherein said first and second top sinker regions have a similar doping level and said first and second buried collector regions have a similar doping level.

3. The device according to claim 1, wherein the first termination region is of the second conductivity type and the second termination region is of the first conductivity type.

4. The device according to claim 3, wherein said first and second termination regions extend in a ring around said first and second base regions respectively, and said first and second buried collector regions respectively.

5. The device according to claim 3, further comprising a first and a second surface collector region, the first surface collector region having the first conductivity, type extending inside said first active area between said surface and said first well region and being arranged between said first top sinker region and the first termination region, the second surface collector region having the second conductivity type extending inside the second active area between said surface and said second well region and being arranged between the second top sinker region and the second termination region.

6. The device according to claim 5 wherein said first and second termination regions extend in a ring around said first and second base regions respectively, and said first and second buried collector regions respectively, said first and second surface collector regions extending ring-like around said first and second termination regions respectively.

7. The device according to claim 1, further comprising a first base-contact region and a second base-contact region formed inside the first and second base regions respectively and facing said surface.

8. The device according to claim 7, wherein the first and second base-contact regions extend ring-wise at a distance around said first and second emitter regions respectively.

9. The device according to claim 1, further comprising a bottom sinker region of said first conductivity type, extending through said first well region between said first top sinker region and the second buried layer.

10. The device according to claim 1, comprising an SOI substrate including a handle layer, an insulating layer and a bottom layer forming the first and second buried layers, said trenches extending as far as said insulating layer.

11. The device according to claim 1, further comprising a substrate of said second conductivity type and an insulation layer of the first conductivity type, extending between said substrate and said first buried layer, said trenches extending as far as said insulation layer.

12. The device according to claim 1, comprising a first shallow-trench termination region and a second shallow-trench termination region extending in a respective active area between a respective top sinker region and a respective base region, the first and second shallow-trench termination regions being at least partially of electrically insulating material and extending from said surface as far as at least one respective well region.

13. The device according to claim 12, wherein the first and second shallow-trench termination regions have a smaller width than the first and second delimitation trenches respectively.

14. The device according to claim 1, further comprising a JFET formed in a third active area surrounded by a third delimitation trench and including:
   a third buried layer of the first conductivity type;
   a fourth buried layer of the second conductivity type, adjacent to the third buried layer;
   a third well region of the first conductivity type on top of the third buried layer;
   a fourth well region of the first conductivity type on top of the fourth buried layer;
   a bulk region, of the first conductivity type, on top of the third well region;
   a channel region, of the second conductivity type, on top of the fourth well region;
   a gate-contact region, of the second conductivity type, inside said bulk region; and a source-contact region and a well-contact region, of the second conductivity type, on opposite sides of the channel region.

15. A process for manufacturing a vertical-type, integrated bipolar device, comprising:
   providing a bottom layer of semiconductor material;
   introducing dopant ion species so as to form a first buried layer of a first conductivity type inside a first area of said bottom layer;
   introducing dopant ion species so as to form a second buried layer of a second conductivity type inside a second area of said bottom layer;
   growing a first epitaxial layer on top of said bottom layer;
   forming a first well region of the first conductivity type inside said first epitaxial layer, on top of the first buried layer;
   forming a second well region of the second conductivity type inside said first epitaxial layer, on top of the second buried layer;
   growing a second epitaxial layer on top of said first epitaxial layer;
   forming a first delimitation trench surrounding a first active area including the first buried layer and the first well region;
   forming a second delimitation trench surrounding a second active area including the second buried layer and the second well region;
   forming a first top sinker region of the first conductivity type inside the second epitaxial layer and the first active area, thereby the first top sinker region extends from said surface as far as at least the first well region;
   forming a second top sinker region of the second conductivity type inside the second epitaxial layer and the second active area, thereby the second top sinker region extends from said surface as far as at least the second well region;
   forming a first buried collector region, of the first conductivity type inside the second epitaxial layer and the first active area, thereby the first buried collector region extends on top of the first well region and laterally with respect to the first top sinker region;
   forming a second buried collector region, of the second conductivity type inside the second epitaxial layer and the second active area, thereby the second buried collector region extends on top of the second well region and laterally with respect to the second top sinker region;
   forming a first base region, of the second conductivity type, inside the second epitaxial layer and the first active area, thereby the first base region extends between said surface and the first buried collector region, laterally with respect to the first top sinker region;
   forming a second base region, of the first conductivity type, inside the second epitaxial layer and the second active area, thereby the second base region extends between said surface and the second buried collector region and laterally with respect to the second top sinker region;
   forming a first emitter region, of the first conductivity type inside the first base region and facing said surface;
   forming a second emitter region, of the second conductivity type inside the second base region and facing said surface;
   forming a first termination region inside the second epitaxial layer, wherein the first termination region extends between said surface and said first well region, extends between the first top sinker region and the first base region, and extends below at least a portion of the first base region; and
   forming a second termination region inside the second epitaxial layer, wherein the second termination region extends between said surface and said second well region, extends between said second top sinker region and the second base region, and extends below at least a portion of the second base region.

16. The process according to claim 15, wherein said first and second top sinker regions have a similar doping level and said first and second buried collector regions have a similar doping level.

17. The process according to claim 15,
   wherein the first termination region is of the second conductivity type
   and the second termination region is of the first conductivity type.

18. The process according to claim 17, wherein:
   forming a first buried collector region comprises forming simultaneously a first surface collector region of the first conductivity type, inside the second epitaxial layer between the first top sinker region and the first termination region, the first surface collector region extending between said surface and the first well region; and
   forming a second buried collector region comprises forming simultaneously a second surface collector region of the second conductivity type, inside the second epitaxial layer between the second top sinker region and the second termination region, the second surface collector region extending between said surface and the second well region.

19. The process according to any claim 15, comprising, before growing the second epitaxial layer, forming a bottom sinker region of the first conductivity type, inside the first well region, thereby the bottom sinker region extends between the first top sinker region and the first buried layer.

20. The process according to claim 15, wherein the step of providing a bottom layer comprises using an SOI substrate including a handle layer, an insulating layer, and said bottom layer, and said trenches are dug as far as the insulating layer.

21. The process according to claim 15, wherein the step of providing a bottom layer comprises using a substrate of said second conductivity type, implanting dopant ion species of the first conductivity type for forming an insulation layer extending between the substrate and the first buried layer, and said trenches are dug as far as the insulation layer.

22. The process according to claim 15, comprising digging a first shallow trench and a second shallow trench from said surface to at least one respective well region, between a respective top sinker region and a respective base region, said first and second shallow trenches being filled at least partially with electrically insulating material.

23. The process according to claim 22, wherein the step of digging a first shallow trench and a second shallow trench is performed at the same time as the step of forming a first delimitation trench and a second delimitation trench, wherein the first and second shallow trenches have a width smaller than the first and second delimitation trenches respectively.

24. The process according to claim 15, further comprising the steps of forming a JFET in an own active area surrounded by an own delimitation trench and including the steps of:
   forming a third buried layer of the first conductivity type in the bottom layer;
   forming a fourth buried layer of the second conductivity type, in the bottom layer and adjacent to the third buried layer;
   forming a third well region of the first conductivity type, in the first epitaxial layer on top of the third buried layer;

forming a fourth well region of the first conductivity type, in the first epitaxial layer on top of the fourth buried layer;

forming a bulk region, of the first conductivity type, in the second epitaxial layer on top of the third well region;

forming a channel region, of the second conductivity type, in the second epitaxial layer on top of the fourth well region;

forming a gate-contact region, of the second conductivity type, inside the bulk region; and forming a source-contact region and a well-contact region, of the first conductivity type, on opposite sides of the channel region.

25. The process according to claim 15, wherein, after the step of growing a first epitaxial layer, the first epitaxial layer has a conductivity lower than $10^{15}$ and, after the step of growing a second epitaxial layer, the second epitaxial layer has a conductivity lower than $10^{15}$.

26. A complimentary integrated bi-polar device comprising:
   a semiconductor substrate;
   a first trench in the substrate which delimits a first active region of the substrate;
   a first buried layer of a first conductivity type in the first active region;
   a first collector contact region in the first active region and of the first conductivity type;
   a first emitter region in the first active region and of the first conductivity type;
   a first base region surrounding the first emitter region and of a second conductivity type;
   a first top sinker region of the first conductivity type surrounding the first collector contact region and extending toward the first buried region; and
   a first termination region of the second conductivity type extending toward the first buried region, laterally separating the first base region from the first top sinker region, and extending below at least a portion of the first base region.

27. The device according to claim 26 comprising:
   a second trench which delimits a second active region in the substrate;
   a second buried layer of the second conductivity type in the second active region;
   a second collector contact region in the second active region and of the second conductivity type;
   a second emitter region in the second active region and of the second conductivity type;
   a second base region surrounding the second emitter region and of the first conductivity type;
   a second top sinker region of the second conductivity type surrounding the second collector contact region and extending toward the second buried region; and
   a second termination region of the first conductivity type extending toward the second buried region, laterally separating the second base region from the second top sinker regions, and extending below at least a portion of the second base region.

28. The device according to claim 27 comprising first and second well regions of respective first and second conductivity types between respective first and second buried regions and respective first and second base regions.

29. The device according to claim 28 comprising:
   first and second upper collector regions between the respective first and second termination regions and the respective top sinker regions; and
   first and second lower collector region between the respective first and second buried regions and the respective first and second base regions.

* * * * *